United States Patent [19]

Fey et al.

[11] Patent Number: 4,813,130

[45] Date of Patent: Mar. 21, 1989

[54] AUTOMATIC EXTRUSION PINNING METHOD AND APPARATUS

[75] Inventors: Donald Fey, Vestal; John T. Legg, Glen Aubrey; Mark V. Pierson, Binghamton, all of N.Y.

[73] Assignee: International Business Machines, Armonk, N.Y.

[21] Appl. No.: 41,399

[22] Filed: Apr. 23, 1987

[51] Int. Cl.⁴ .......................... H05K 3/00; B23P 19/00
[52] U.S. Cl. .......................... 29/845; 29/747; 174/68.5; 427/97
[58] Field of Search .......... 29/832, 895, 747; 228/179; 427/97; 174/68.5

[56] References Cited

U.S. PATENT DOCUMENTS

| | | | |
|---|---|---|---|
| 3,302,272 | 2/1967 | Braun | 29/832 X |
| 3,354,260 | 11/1967 | Brandt et al. | 174/68.5 |
| 3,484,935 | 12/1969 | Burns | 174/68.5 X |
| 3,601,523 | 8/1971 | Arndt | 174/68.5 |
| 3,971,610 | 7/1976 | Buchoff et al. | 174/68.5 X |
| 4,050,756 | 9/1977 | Moore | 29/845 X |

FOREIGN PATENT DOCUMENTS

| | | | |
|---|---|---|---|
| 51378 | 5/1982 | European Pat. Off. | 427/97 |
| 8501415 | 3/1985 | PCT Int'l Appl. | 427/97 |

*Primary Examiner*—Carl J. Arbes
*Attorney, Agent, or Firm*—Douglas M. Clarkson

[57] ABSTRACT

The method and apparatus described in the disclosure utilizes the known technique of extrusion to form a plurality of very small pins, with diameters of 0.020 inch or smaller, in a substrate of electrically nonconductive material. The number of pins is 360 or more, and the electrically conductive material described in the extrusion process is copper. A pin die is formed with the same number and pattern of holes as are in a blank substrate, and it is positioned over an extrusion die with matching orifices that is fixed on an extrusion press. A head die presses the blank substrate firmly on the pin die during the extrusion operation, and when completed, the pins are sheared and the substrate is ejected as a new blank is positioned to repeat the cycle.

32 Claims, 5 Drawing Sheets

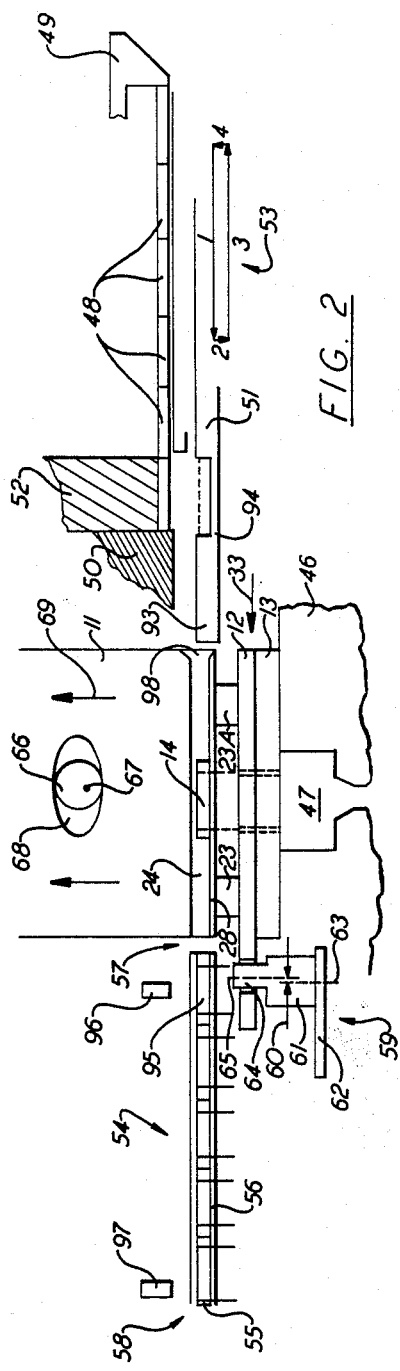
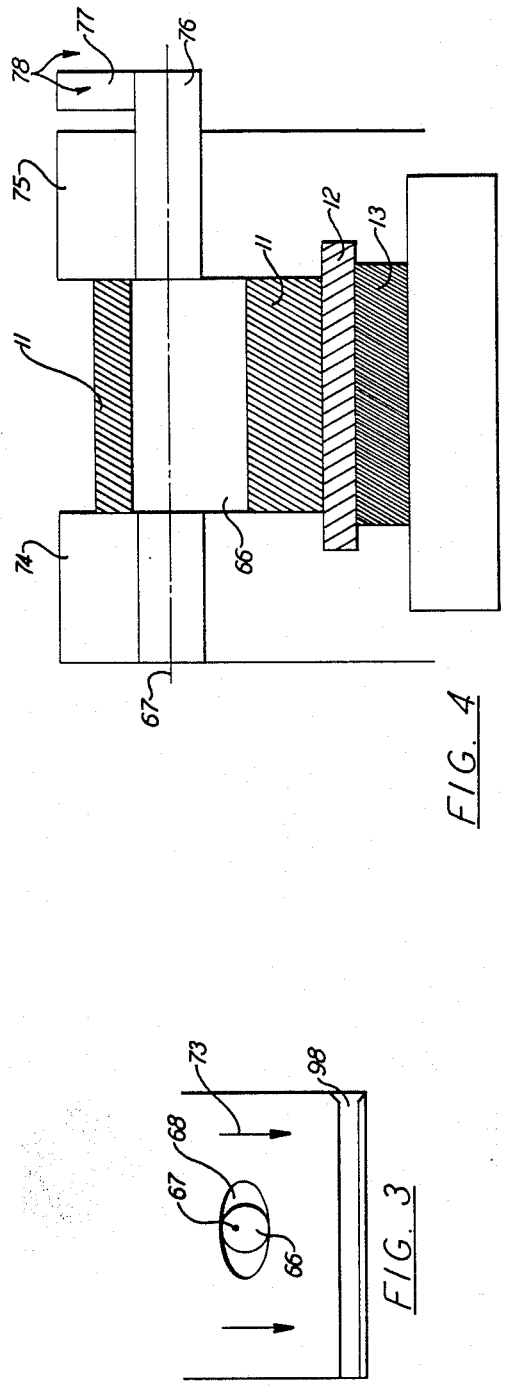

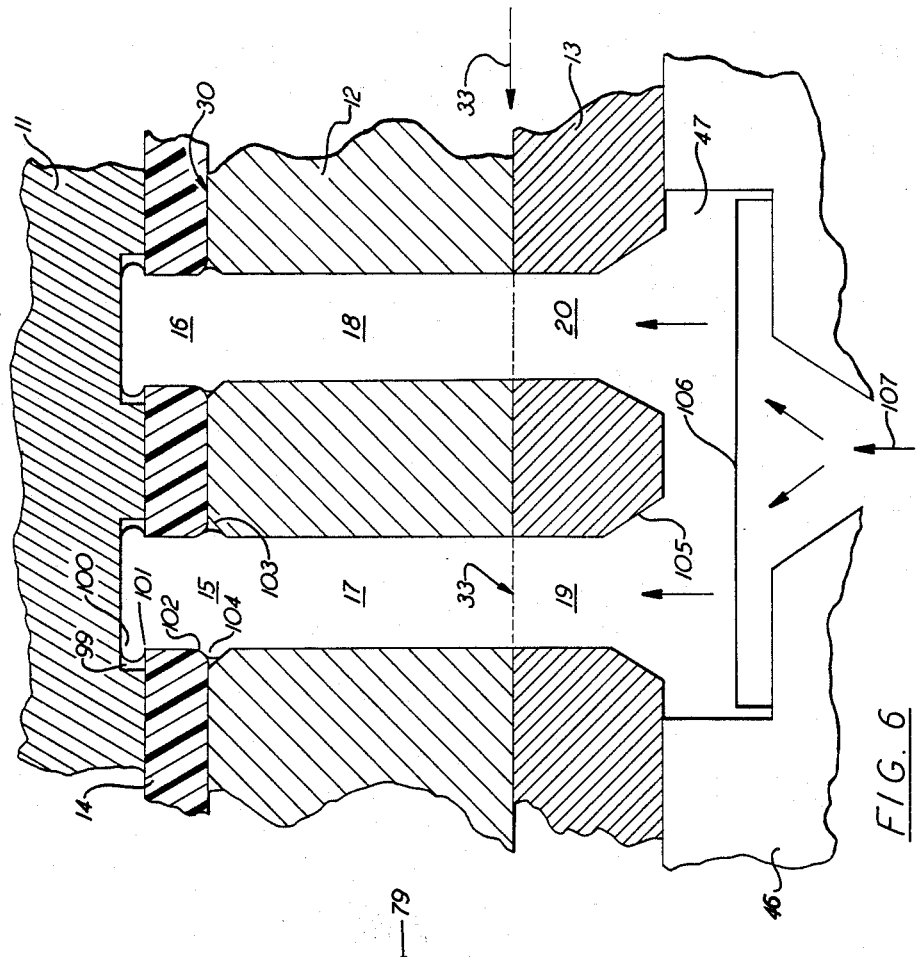
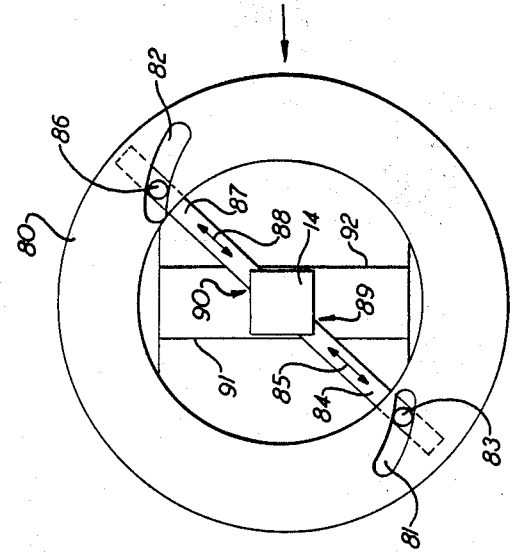

AUTOMATIC EXTRUSION PINNING METHOD AND APPARATUS

BACKGROUND OF THE INVENTION

1. Field of Invention

The field of art to which this invention relates includes, generally, the manufacture of "cards" or substrates on which are formed or mounted electrical circuits and, more particularly, includes a new and improved method and apparatus for forming a plurality of pins automatically on a substrate.

2. Description of the Prior Art

The method used today for mounting a plurality of pins on a substrate is embodied in an apparatus having three major functions: (1) multiple pin feeding into a plurality of holes preformed in each substrate, (2) substrate feeding into this machine and (3) the attaching (or fixing) of each pin within its hole to hold it in place (called a "heading" and "bulging" operation). These functions are performed, along with other less primary operations, on seven separate stations of an eight station rotary indexing machine.

The multiple pin feeding function involves a linear vibrator, pin feeding tube and a pin escapement mechanism. Several thousands of pins are dumped into a vibrating "hopper" (area). They are separated and vibrated down a "V" shaped slot into a tube. The tube, in turn, connects the vibrator to a pin escapement device where the pins are released and pushed, as a group, into an awaiting pin holder and positioner on the index table.

Next, the index table rotates to a substrate loading station where one substrate is positioned to receive the pins being held in the pin holder.

With each hole in the substrate (360 or more) being filled with a pin, the index table rotates, again, to a "heading" and a "bulging" station where the group of pins is cold formed for retention mechanically in the holes. Finally, the index table rotates to another station for ejecting the completed substrate.

While the eight station rotary indexing machine has performed effectively in the past, it has not been entirely without problems. Getting a great number of very small, preformed pins into hundreds of small holes automatically has been one of the problems, and the cold forming of each pin frequently results in loose pins.

As technology has advanced over the past years, the diameter of these preformed pins has become smaller and smaller, until today when the diameter is 0.020 inch, and the length approximates 0.25 inch. Smaller pin sizes make the feeding of thousands of preformed pins by vibrating into smaller holes in the substrate such a limitation that the efficiency of the eight station rotary indexing machine is affected dramatically.

Utilizing the present invention, the disadvantages of the prior eight station machine are avoided entirely. The number of working stations is reduced from eight to one, there are no loose preformed pins to feed into very small holes, the speed of operations is increased, cost is reduced and all pins are fixed firmly in place.

SUMMARY OF THE INVENTION

The presently preferred embodiment of the invention includes features by means of which the above advantages are realized.

It is a principal object of the present invention to provide a new and improved method and apparatus for forming a plurality of holes in a substrate with a pin of electrically conductive material.

Another object of the present invention is to provide a new and improved method for forming pins of electrically conductive material in holes preformed in a substrate of electrically nonconductive material.

Still another object of the present invention is to provide a new and improved apparatus to overcome the above-mentioned disadvantages of the presently used eight station machine.

Briefly, a method in accordance with the present invention involves the steps of positioning a substrate of electrically nonconductive material in which are preformed a plurality of holes in a predetermined pattern contiguous with a pin die in which a plurality of pin channels are located in a pattern that matches the substrate holes, pressing the substrate firmly against the pin die, directing an electrically conductive material through the pin die channels and through the substrate holes, and ejecting the substrate with pins thus formed from the contiguous position with the pin die.

A new and improved apparatus, in accordance with the present invention, to carry out the above method includes a pin die with a plurality of pin channels in a pattern that matches the pattern of holes in a substrate, a head die to press the substrate firmly against the pin die, means to direct an electrically conductive material through the pin channels and through the holes in the substrate to form a pin in each of the substrate holes, and means to eject the pinned substrate from between the pin die and the head die.

Other objects and advantages of the invention will become apparent as the description proceeds.

BRIEF DESCRIPTION OF THE DRAWINGS

For a fuller understanding of the nature and objects of the present invention, reference is made to the following detailed description taken in conjunction with the accompanying drawings, in which:

FIG. 2 is a view of the apparatus, in layout form, for use as an aid in describing a complete cycle of operation of the method and the apparatus of the invention.

FIG. 3. is a view of just the head die with its actuator in position for the head die to be fully lowered (in the opposite location from the head die and actuator shown in FIG. 2).

FIG. 4 is a view to illustrate primarily the relationship of the head die actuator of FIG. 2 and FIG. 3 to the other features shown in FIG. 1, also as an aid in describing the invention.

FIG. 5 is a diagrammatic illustration of a corner locator actuator for positioning a substrate accurately in accordance with one feature of the invention.

FIG. 6 is a diagrammatic illustration of two pins formed in position within two holes of a substrate as an aid in describing the preferred form of the apparatus of the invention.

DETAILED DESCRIPTION

It is presently contemplated that the method and the apparatus of the invention will utilize the technique of metal working known as "extrusion". In this form of metal working, it has been determined that the following relationship obtains:

Deformation load = Yield stress × Area of contact.

The particular metal being used today for substrate pins is copper, and since copper that is at least 99.90% pure has a relatively low tensile strength equal to 32,000 lb./in.$^2$, it seems ideal for use in the method and apparatus of the invention.

Another important factor that affects yield stress is the temperature of the metal during use. It is known that as the temperature of the metal is increased, the load required decreases. However, this factor cannot be taken advantage of in the present invention because for the pins of a substrate to be effective, they must be electrically conductive at very low voltages.

At lower temperatures, the pins formed in a substrate by the present invention will be bright with clean surfaces. At higher temperatures, the pins tend to be discoloured and have an oxidized coating on the surfaces. Such oxidation tends to reduce electrical conductivity. Also, at lower temperatures, the tolerances are maintained better, strength and hardness of the pins are higher and the ductility of the pins is lower.

The extrusion technique that is used in the present invention involves applying a deformation load to a metal, such as copper, to cause it to flow. The first known attempt at studying the flow characteristics of metals is described in a publication entitled, "Mitteilungen aus dem Kaiser-Wilhelm Inst." in 1933 by Siebel, E. and Lueg, W. However, since that first work, much has been done to further the extrusion process as a means of metal working and much has been written on the subject.

Figure 1:
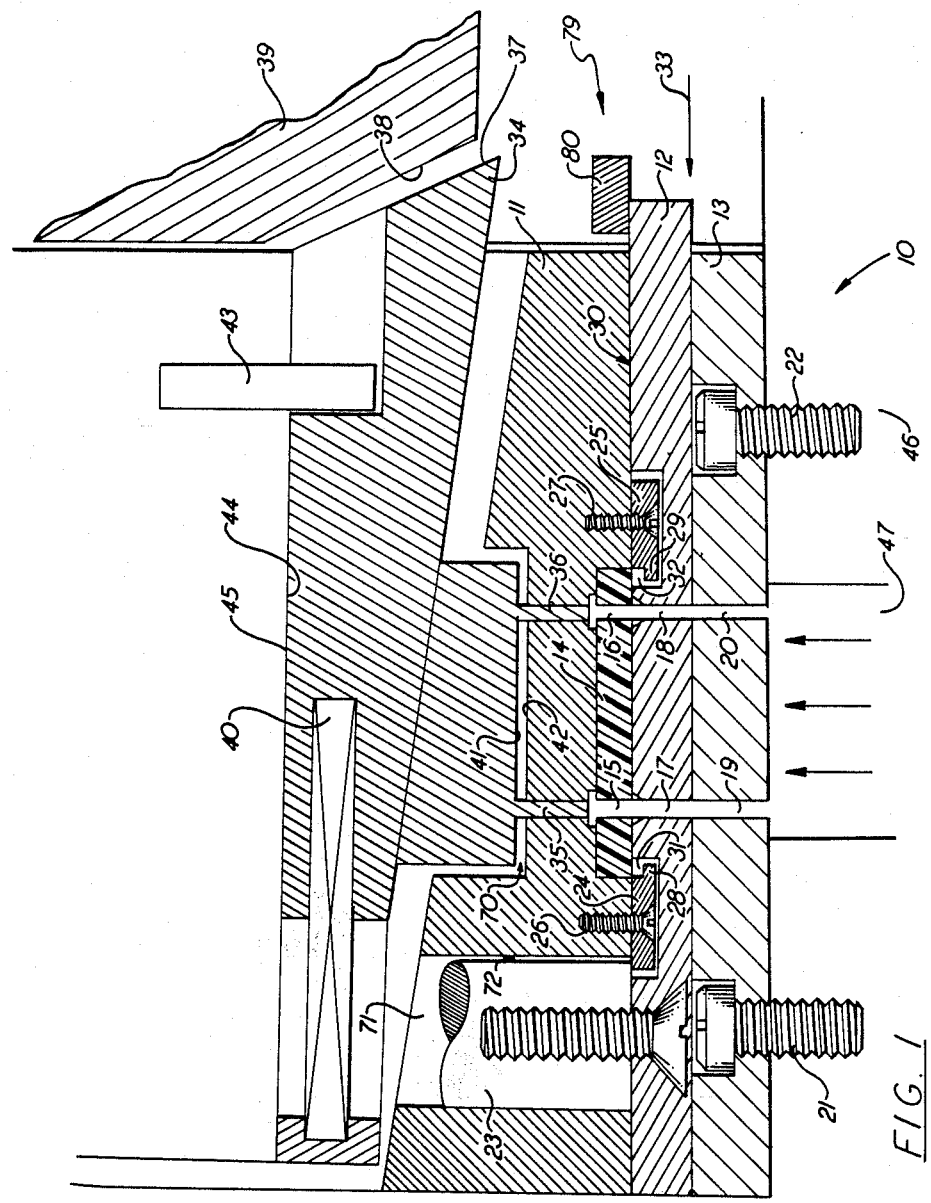
FIG. 1 is a view in cross section, partly diagrammatic, for use as an aid in describing the feature of the method and apparatus of the invention.

Referring now to FIG. 1 of the drawings, an apparatus that is constructed and arranged in accordance with the invention is identified generally by the reference numeral 10. The apparatus 10 has a head die 11, a pin die 12 and an extrusion die 13.

Extrusion is a relatively new process of fabricating metals, and the problems of suitable die material to withstand the high pressures required to extrude metal were not overcome until well into the twentieth century. A suitable material of which the head die 11, the pin die 12 and the extrusion die 13 may be formed is tungsten carbide, but new materials are being developed more rapidly today. Therefore, it is understood that the invention is not limited to any particular material for the dies 11, 12 and 13.

It is known that the most important part of the extrusion apparatus is the die, and usually a die will consist of two parts, a casing and a nib. The casing is that part shown in the drawings and identified by the reference numerals 11, 12 and 13. It is this casing that is made of tungsten carbide, whereas the nib (not visible) is the lining of the holes or apertures through which the metal is forced, and it is this lining that is made of industrial diamond.

Of course, the use of industrial diamond as a lining for extrusion dies is not new. It has been used for many years and, therefore, forms no part of the present invention. It is particularly useful for smaller diameter extrusions, and in this instance, the pins have a diameter of 0.020 inch or smaller.

Returning to FIG. 1 of the drawings, while a substrate 14 may be formed with any number of holes in any number of patterns to fit a particular need of an electrical circuit to be formed later, only two holes 15 and 16 are shown in the drawings. As pointed out hereinabove, the number of the holes can be 360 or more.

The number and the pattern of the plurality of holes in the substrate 14 are matched by the number and the pattern of a plurality of pin channels, illustrated by the two pin channels 17 and 18 in the pin die 12 and also by the plurality of orifices, illustrated by the two orifices 19 and 20 in the extrusion die 13. The holes 15 and 16 in the substrate 14, the pin channels 17 and 18 in the pin die 12 and the orifices 19 and 20 in the extrusion die 13 will be described in more detail in the description that follows.

When the number and/or the pattern of the holes in the substrate 14 are changed, a new pin die 12 and a new extrusion die 13 can be installed if desired. Preferably, however, the pin die 12 has a full pattern of holes (channels), and the extrusion die 13 has a matching, full pattern of holes (orifices). Then, the holes that are not to be used for a particular group of substrates are closed off by plugs in the orifices 19 and 20 of the extrusion die 13. The extrusion die 13 is removable, however, by removing a plurality of bolts, represented by the two bolts 21 and 22.

The pin channels 17 and 18 are held in position relative to the holes 15 and 16 by a plurality of guide posts, one of which is indicated by the guide post 23.

Continuing now with an identification of the respective component parts of the apparatus of the present invention, two strips 24 and 25 are attached to the head die 11 by a plurality of threaded bolts, like the two bolts 26 and 27. The strips 24 and 25 are spaced apart a distance at least equal to the width of the substrate 14, so that upon first loading the substrate 14 in the apparatus, the substrate 14 will rest on flanges 28 and 29 extending along one edge of each strip 24 and 25, respectively.

After the substrate loading mechanism is retracted, as will be described in more detail presently, the head die 11 is moved to press the substrate 14 tightly and firmly against a support surface 30 on the pin die 12, leaving the spaces 31 and 32 above the flanges 28 and 29, respectively. The two spaced apart strips 24 and 25 will have to be moved if substrates having different widths are to be used in the apparatus 10, but the plurality of bolts, like the bolts 26 and 27, readily permit such an adjustment in this width.

After a pinning operation is completed, the head die 11, the substrate 14 and the pin die 12 are moved to shear the pin material along a line indicated by the arrow 33. Then, the head die 11, the substrate 14 and the pin die 12 are all returned to their original respective positions, and the extrusion action is begun again as the head die 11 is retracted to eject the pins.

A substrate ejector 34 has a plurality of small, pin-like protrusions, two of which are shown and identified by the reference numerals 35 and 36, that fit in openings above each hole 15 and 16 in the substrate 14. After the pin shearing operation along the line indicated by the arrow 33, the head die 11 is separated from the pin die 12 but guided by the guide posts, indicated by the one guide post 23, until an inclined surface 37 encounters a surface 38 on a stationary part 39, forcing the substrate ejector 34 against a spring 40.

The force required to eject a completed substrate 14 is minimal, and the action of the inclined surface 37 coming against the stationary surface 38 causes a surface 41 from which the pin-like protrusions 35 and 36 extend to be closed against a surface 42 on the head die 11, in order to eject the substrate 14. Once ejected, the substrate 14 will be removed by parts yet to be described, but then, the spring 40 moves the substrate ejector 34 to return it against a stop pin 43. Initially, with a substrate 14 in place and before the extrusion operation has begun, the plurality of pin-like protrusions 35 and 36 will be at the surface of the substrate 14 with the ejector surface 41 resting against the head die surface 42. This position provides several advantages, one of which is that it ensures proper alignment of the protrusions 35 and 36 for later ejecting the completed substrate 14 and, second, it provides an indicator of the progress of the extrusion operation when the substrate ejector 34 raises up slightly and when the protrusions 35 and 36 are in the position shown in FIG. 1.

The plurality of bolts, of which the bolts 21 and 22 are indicated, are used to attach the apparatus of the invention 10 to a typical extrusion press, identified by the reference numeral 46. Such extrusion presses are available readily today for extruding such metals and their alloys as aluminium, copper, lead and even steel. A typical press for extruding copper has about a 5000 ton ram-load capacity and consists of a heavy steel shell lined with heat-resisting alloy steel and an extrusion cavity 47.

Since specific structure will depend upon a wide variety of uses to which the apparatus of the invention is adapted, it is deemed to be more important to present a complete description of the principles involved, and accordingly, reference is made now to FIG. 2 of the drawings. The same reference numerals are used throughout the drawings to identify the sam or similar parts.

FIG. 2 shows more of the principles of loading substrates into the apparatus of the invention and of unloading the completed ones after the pinning is finished. However, this view is rotated 90 degrees from that of FIG. 1, so that in this view, the substrate 14 moves from right to left, whereas, in FIG. 1, the substrate 14 moves outwardly, toward the reader.

Substrate Loading

There is a great number of escapement actuators available to cause the needed movements that are about to be described. Therefore, just the principles required to accomplish the method of the invention will be identified.

In accordance with the invention, the substrates having holes preformed in the desired number and pattern are arranged edge-to-edge, as indicated by the reference numeral 48. A suitable force is maintained on the blank substrates 48 by a slide 49 to urge them toward a stop 50. At the stop 50, a substrate 48 will be in a correct position for loading onto a loading arm 51, and this correct position is identified by the numeral 52.

At the proper time in the cycle of operations when the head die 11 is in its raised position, the loading arm 51 moves to the left, as viewed in FIG. 2, to an approximate location, indicated now in FIG. 2 by the substrate 14.

The movement of the loading arm 51 just described would be, looking at FIG. 1, toward the reader, in the space now occupied by the substrate 14 and between the two flanges 28 and 29 of the strips 24 and 25. At this point in its movement, the loading arm 51 moves downwardly, as viewed in FIG. 2, which leaves the blank substrate resting on the two flanges 28 and 29.

The loading arm 51 then is retracted and raised back to its original position for receiving another blank substrate at the position 52. Such movements of the loading arm 51 are illustrated by the motion arrow diagram 1, 2, 3 and 4 that is adjacent to the loading arm 51. The motion arrow diagram is identified also by the reference numeral 53.

Substrate Unloading

A tray 54 is shown to the left in FIG. 2 that is filled in one lineal direction with completed, pinned substrates. The operating part of the tray 54 is two strips that are spaced apart like the strips 24 and 25 in FIG. 1. One of the strips, identified by numeral 55, is visible in FIG. 2. The strip 55 has a flange 56 that is like the flange 28 on the head die 11.

The tray 54 has a suitable sensor to indicate when the tray is full. An alternative sensor is a counter at the end 57, but the preferred arrangement is a combination of both, i.e., a counter 96 at the end 57 and also a sensor 97 at the opposite end 58. By such an arrangement, the total number of completed substrates is available on the counter, and the sensor at the end 58 of the tray 54 makes the operation more automatic by providing appropriate indexing signals.

A typical unloading operation is initiated by the head die 11 as it is raised away from the pin die 12 in order to eject a completed substrate 14. At this point in time, the tray 54 begins to move to the right, as viewed in FIG. 2, and it arrives beneath the substrate 14 as it is ejected by the protrusions 35 and 36.

The ejection of the substrate 14 deposits it on the two flanges of the tray 54, the flange 56 begin visible in FIG. 2. As the tray 54 is about to be retracted, the substrate loading arm 51 arrives with a blank substrate, and this pushes the completed substrate 14 to the left, as viewed in FIG. 2, further on the tray 54. The tray 54 moves out of the way, back to the left to its original starting position. Thus, one cycle of the unloading operation is completed.

Pin Shearing Operation

As described above, before a blank substrate is loaded, a completed, pinned substrate must be ejected. The loading of a blank substrate will assist the removal of the completed substrate, but before these operations are performed, the completed pins must be sheared from the extrusion material.

To accomplish a shearing action along the line 33, as described previously, a shear actuator mechanism 59 is operated. The distance of movement needed to perform this shearing operation is very small because of the small diameter of the extruded pins, and such distance indicated by the arrows 60 represents one-half of the distance of movement by the shear actuator mechanism 59.

A rotatable arm 61 is connected to a suitable means to move it by a positive attachment 62. By a "positive" connection is meant that no slippage is involved.

As stated previously, the number of suitable means to move something is large and forms no part of the present invention. The attachment 62 to the selected means to move it, to be appropriate for the present apparatus, is one that cannot slip, because while the diameter of each pin is on the order of 0.020 inch, a large number of these pins is formed in each substrate, on the order of 360 or more. Any slippage in the actuation of the shearing mechanism will upset the timing of such operations as the loading and unloading of substrates, described above.

A modification of the arm 61 is that it is pivotable rather than rotatable, by the attachment 62, and it may be pivoted any needed degree between 0 and 180.

Therefore, the arm 61 is either pivotable or rotatable about an axis 63, so that a cam 64 that is offset on an axis 65 will move the pin die 12 left and right along the shear line 33. Through the plurality of guide posts 23 and 23A, the head die 11 and the substrate 14 are moved with the pin die 12. This shearing action will be referred to in more detail hereinafter.

Head Die Actuator

Also visible in FIG. 2 of the drawings is a roller 66 that is mounted eccentrically on an axis 67. The roller 66 is fitted snugly within an opening 68 in the head die 11, so that as the head die 11 is moved in the direction of the arrows 69, away from the pin die 12, and encounters the surface 38 through the substrate ejector 34, FIG. 1, the roller 66 will be at its highest point of lift for the head die 11.

As best seen in FIG. 1, when the inclined surface 37 encounters the stationary surface 38, as the head die 11 is moved away from the pin die 12, the first event to occur is the closing of a space 70 which separates the surfaces 41 and 42. The force of this encounter is sufficient to eject the substrate 14 downward.

FIG. 3 of the drawings illustrates the position of the eccentric roller 66 acting within the opening 68 when the head die 11 is in its lowermost position, indicated by the arrows 73. With the roller fitting snugly within the opening 68, the head die 11 is locked securely in any location it is in.

FIG. 4 of the drawings shows in somewhat diagrammatic form the location of the eccentric roller 66 with the head die 11, the pin die 12 and the extrusion die 13. The axis 67 for the roller 66 extends through its bearing supports 74 and 75, and a shaft 76 which terminates in an actuator arm 77 which is movable as indicated by the arrow 78.

Like the positive attachment 62 in FIG. 2, the actuator arm 77 is operated by means of a suitable escapement device (not shown), but it can be the same device, or at least timed with it. Also like the arm 61 in FIG. 2, the actuator arm 77 is movable in a rotatable manner or, preferably, in a pivotable manner.

Substrate Corner Locator

FIG. 5 of the drawings illustrates generally the operating principles involved in a corner locator 79 for positioning the substrate 14 accurately and for retaining it in that position laterally. The operating part of the corner locator 79 is a circular ring 80, also visible in FIG. 1.

The ring 80 has cam slots 81 and 82 formed diametrically opposite each other, as illustrated. A cam member 83 is attached to a slide 84 and is fitted within the cam slot 81, so that as the ring 80 is moved, the slide 84 is moved as indicated by an arrow 85.

A cam member 86, similar to the cam member 83, is attached to a slide 87 and is fitted within the cam slot 82 to move the slide 87, as indicated by an arrow 88, as the ring 80 is moved. Each of these slides 84 and 87 have respective ends 89 and 90 that are formed to match the corners of the substrate 14.

As viewed in FIG. 1 of the drawings, the corner locator 79 is shown from the bottom of FIG. 1 looking up, and from that aspect, the view in FIG. 5 is seen. The substrate 14 is shown fitted within a recess having slides 91 and 92, and these slides 91 and 92 are indicated by lines 91 and 92 in FIG. 5.

As described hereinabove in connection with the loading of a blank substrate, the substrate 48 is moved along the recess in the head die 11 by the loading arm 51, to an approximately correct location before it is deposited on the flanges 28 and 29, FIG. 1. Then, by adjusting the ring 80 to move the slides 84 and 87 to grip opposite corners of the blank substrate firmly, it is positioned accurately.

Simplified Loading and Unloading Arrangement

To simplify a complex operation or procedure is desirable because it has a concurrent benefit of reduced cost, and in this connection, there are instances when the following modified arrangement is appropriate.

Instead of the tray 54, in FIG. 2, being movable, it can be fixed in position, and the substrate loading arm 51 has an end 93 that is sufficiently ahead of the leading end of the blank substrate being loaded to push the completed substrate 14 in a sliding manner along the flanges 28 and 29 to a position on the tray 54.

As mentioned hereinabove, a counter 96 is actuated by each edge of a substrate that passes, and a sensor 97 produces a signal causing the tray 54 to be indexed in a direction that is either toward the reader or into the figure so that a new, empty tray is moved into position for loading.

The reference numeral 98 is used to identify a flared entrance into the space above the two flanges 28 and 29 to ensure a smooth substrate loading operation.

Pin Die Structure

FIG. 6 shows the presently preferred arrangement for forming each of the hundreds of pins by the extrusion method of the invention. In the surface of the head die 11 that presses against the substrate 14, located above each of the holes, two of which are identified by the numerals 15 and 16, is a hollow, like the hollow 99. The purpose for such a hollow 99 is to form a head 100 above the substrate 14.

A relatively sharp edge about the hole 15 is identified by the numeral 101, while the opposite edge of the hole 15 is curved, as indicated by the numeral 102. Each pin channel, like the pin channel 17, where it opens at the substrate support surface 30, is countersunk, as indicated by the numeral 103, to permit the formation of a bulge 104. Between the pin head 100 against the upper surface of the substrate 14 and the bulge 104 against the lower, or opposite, surface, each pin formed in the substrate 14 by the invention is fixed firmly in place.

The line between the pin die 12 and the extrusion die 13 is the shear line 33.

The end of each orifice furthermost from the shear line 33, like the orifice 19, is countersunk to form a slip line field 105 to permit extruding at higher speeds and better "working" of the metal being extruded. The extrusion cavity 47 in the extrusion press 46 contains the usual ram 106 that is actuated, as indicated by the numeral 107. The details of such an extrusion press 46 are not included because they are well known in that art.

Figure 7:
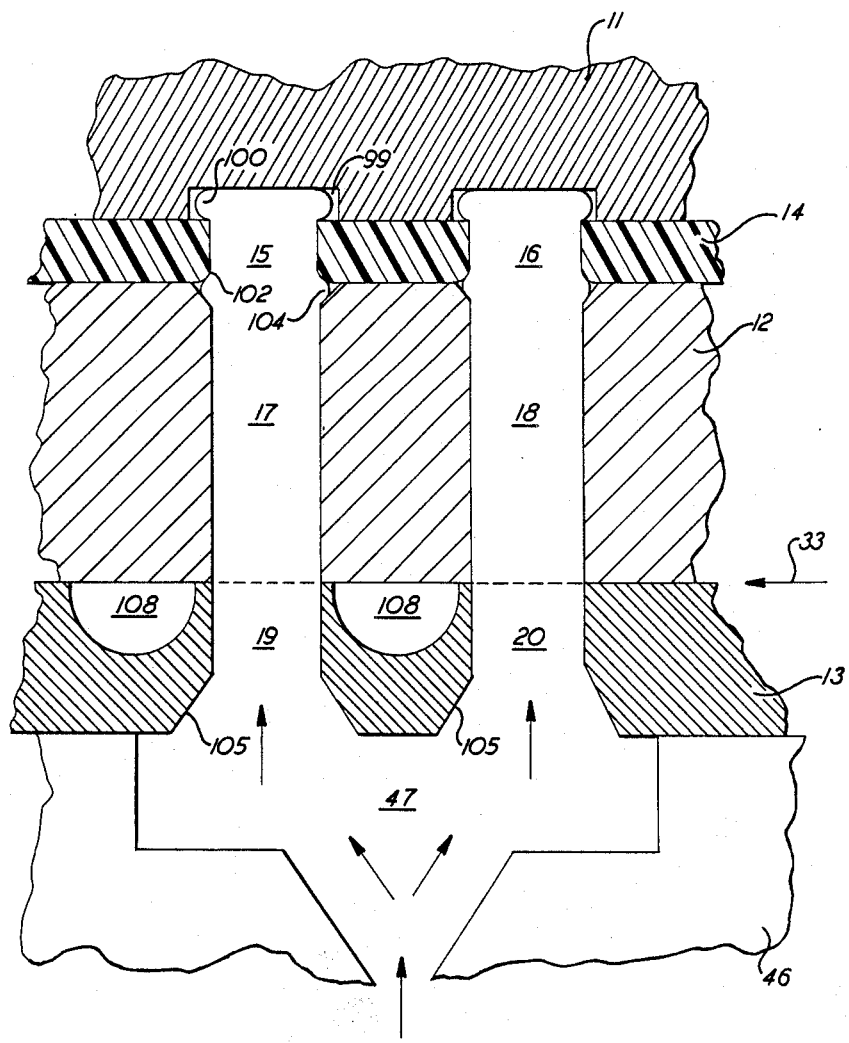
FIG. 7 is an illustration like FIG. 6 to show presently contemplated modification of the invention.

FIG. 7 of the drawings illustrates an important modification of the invention, as will be explained in more detail presently. The essential differences in structure are embodied in the extrusion die 13 as passages 108 adjacent each orifice, such as the orifice 19. Each of the passages is located so that as the pin die 12 is moved to shear the pin material along the line 33, the sheared end of each pin will stop over one of the passages 108.

The passages 108 are all connected to a suitable source of fluid under pressure. Such pressurized fluid is used to eject the pins from the pin die 12. Such fluid is at least used to assist in the otherwise usual ejection of the pins and completed substrate. An example of a suitable fluid is air, although in some instances of use of the invention a liquid would be more appropriate.

Figure 8:
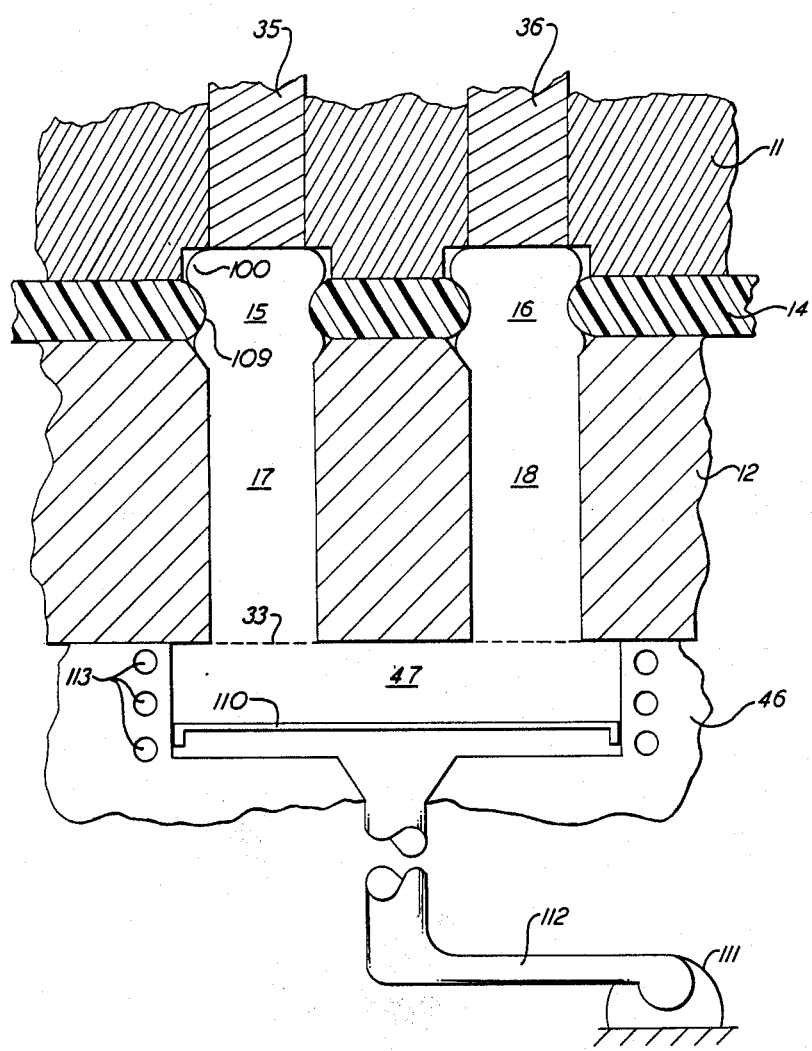
FIG. 8 is an illustration like FIG. 6 and FIG. 7 to show a still further modification of the invention.

FIG. 8 of the drawings illustrates still another modification of the invention. An important omission from the structure of FIG. 8 is the extrusion die 13 shown in all the other figures. The structure in FIG. 8 includes the protrusions 35 and 36, FIG. 1. Yet another modification of the apparatus according to the present invention is seen in the arcuate holes 15 and 16 in the substrate 14.

The formation of the pin head 100 provides two significant purposes, one of which is identified hereinabove and that involves a later use of the pinned substrates. When electrical circuits are formed on the substrates during a later operation, a "land" of electrically conductive material is formed around these heads 100 to provide the required electrical connection.

The other significant purpose of the head 100 is that, along with the bulge 104, the pin is fixed in place firmly. Therefore, as the pin diameters are made smaller and smaller, the head 100 will become smaller also, to a point where its effectiveness for fixing the pin in place mechanically is not sufficient. Whereupon, a structure as illustrated in FIG. 8 provides more mechanical strength in the head 100.

The particular degree of curvature of the arcuate holes and 16 is not as important as the result which they admit, which is the increased strength of the head 100. The arcuate holes 15 and 16 can be curved adjacent the two surfaces of the substrate 14, like the curve 102 shown in FIG. 6, or like the degree of curvature shown in FIG. 8, which is a more continuous curve 109 from one surface of the substrate to the other. The curve 109 will maximize the strength of the head 100.

Since the modification illustrated in FIG. 8 has no extrusion die, it cannot be used with an extrusion press for a metal, but rather, this modified arrangement is for use with one of the new plastic materials that are electrically conductive. In the past, a "plastic" material has only been electrically nonconductive and has been rendered conductive by adding a suitable conductive material in the form of granules or fibers. A plastic material to which either granules or fibers have been added is one of the "polymers".

Such a plastic material is suitable for pins as contemplated by the invention under certain conditions. For example, the use of such a mixture in larger diameter pins is likely to produce spots of either nonconductivity or high resistance. The circuits formed on a substrate with pins of the invention involve very low voltages. There can be no assurance that an electrical arc will bridge a gap between granules or fiber particles, such as in a spark plug, for example, with its voltages on the order of 10,000 volts.

However, in accordance with the present invention, pins are formed by extruding whatever electrically conductive material is selected, and if it is a plastic material, the extrusion process will "work" the material, compressing it to a point where no gaps exists, particularly for pin sizes of 0.020 inch and less in diameter.

In accordance with this aspect of the invention, the extrusion cavity 47 contains the electrically conductive plastic material against which pressure is applied by an appropriate ram 110 (FIG. 8), different from the ram 106 (FIG. 6), because in the extrusion of copper, the ram 106 will fit within the extrusion cavity 47 much more loosely than the ram 110 for extruding plastic. The ram 110 is actuated by an extrusion pump 111 through a suitable pipe 112.

In some instances, the temperature of the plastic material in the extrusion cavity 47 must be maintained at a certain temperature during the extrusion process. This is obtained by suitable tubes 113 in the extrusion press 46 around the walls of the extrusion cavity 47. A heating fluid and/or a cooling fluid is circulated in the tubes 113 either at intervals or alternately, as the need exists. A particular temperature to be maintained will be dictated by such factors as the material, speed of extrusion and ambient temperature.

Returning to the description of the presently preferred form of the invention, that of forming a plurality of pins by the extrusion of copper into a predetermined pattern of holes in a plurality of successive substrates, advantages include the following:

(1) one station apparatus instead of the present eight station machine;

(2) no loose pins to feed since pins are not preformed;

(3) lower cost for the same process (one pin die versus eight);

(4) pin jamming elimination due to bent pins, out of specification. (i.e., diameter, length, hardness);

(5) positive pin material feeding (pushed by high pressure, not by friction and gravity);

(6) very little motion (cycle rate is high);

(7) elimination of individual steel punches in the present eight station machine to eject after shear;

(8) no limitation on size of pins formed (present machined cannot feed pins smaller than 0.020 inch); and (9) improvement of physical properties of pines by the extrusion process due to crystal grain reorientation.

The apparatus of the invention as well as the various modifications that have been described in detail herein operate in accordance with the new and improved method that characterizes the invention. Broadly, the method is carried out by pressing a substrate of electrically nonconductive material, in which have been preformed a plurality of holes in a preselected pattern, tightly against a pin die having pin channels that match the holes in the substrate, while a material that is electrically conductive is extruded through the pin channels, through the holes in the substrate and forming a head in the pin material against one side of the substrate and a bulge against the opposite side to fix the pin material firmly in place. Then, the pin material is sheared from the pins on the opposite side of the pin die from the substrate, and the completed substrate is ejected.

By describing the operation of the apparatus of the invention, other aspects of the method will become apparent. Referring to the drawings, assume that one cycle of operation has just been completed to extrude copper pins. Next, by operation of the arm 61 about the axis 63, the plurality of pins is sheared from the extrusion material along the shear line 33, returning the pin die 12 and head die 11 to their original position. The extrusion process is activated again as, concurrently, the head 11 is moved away from the pin die 12 by the roller 66. The substrate 14 is moved with the head die 11 because it is being pushed by the copper extrusion material and also being pulled by the plurality of heads 100 that are stuck to the head die 11.

As the head die 11 continues to travel away from the pin die 12, the surface 37 encounters the stationary surface 38 causing the plurality of protrusions 35 and 36 to push each of the heads 100 away from the head die 11 and causing the substrate 14 to drop down onto the flanges 28 and 29. In the usual case, the heads 100 are pushed free easily, but if additional force is needed, the head die 11 has room to continue movement causing the surface 37 to slide against the stationary surface 38, compressing the spring 40 and moving the substrate ejector 34 away from the stop pin 43, closing the space 72 against each of the guide posts 23.

As the completed substrate 14 now is freed and supported by the flanges 28 and 29, the substrate loading arm 51 moves into the apparatus 10 with a blank substrate 48, as the end 93 pushes the completed substrate 14 from the apparatus 10 onto the tray 54. After the loading arm 51 is retracted, the blank substrate 48 is left supported by the flanges 28 and 29, and the corner locator 79 is actuated to position the blank substrate accurately on the flanges 28 and 29 relative to the plurality of pin channels 17 and 18 and to retain the blank substrate firmly in place laterally.

The head die 11 then is moved toward the pin die 12 to lock the blank substrate 48 tightly against the surface of the pin die 12. Now, the extrusion press 46 is energized to start the extrusion of the electrically conductive material through the orifices 19 and 20, through the pin channels 17 and 18 and through the holes 15 and 16 in the blank substrate. The progress of the extrusion process at this point is indicated by the protrusions 35 and 36 moving away from the surface of the substrate slightly, the surface 44 coming against the surface 45, causing the two surfaces 41 and 42 to separate creating the space 70.

The extrusion process continues to develop the head 100 and the bulge 104 in each of the pins, and the extrusion is stopped in response to (1) the passage of a preset interval of time, which may be determined by the experience of the operator, (2) the developed extrusion pressure on a suitable sensor, not shown, reaching a predetermined value or (3) the movement of the extrusion ram 106 a preset distance.

To shear the plurality of newly formed pins from the extrusion material, the shear actuator mechanism 59 is operated to shear the pins along the shear line 33 and to return the pin die 12 and the head die 11 to their original position. As the head die is moved away from the pin die 12, the extrusion process is initiated briefly to move the pins out of the pin channels 17 and 18. Actually, the extrusion process is used only to start the newly formed pins to be freed within the pin channels 17 and 18, because once freed, they are removed by the action of the head die 11 and the two flanges 28 and 29.

Having described the method of the invention in detail along with several forms of apparatus to carry it out, other uses of the apparatus will become apparent to those skilled in the art. Also, it will be apparent to those skilled in the art that various changes and modifications may be made in the apparatus that is described. This invention, therefore, is intended to be limited only by the appended claims.

What is claimed is:

1. An apparatus for forming pins by extrusion in a substrate having openings arranged in a predetermined pattern, comprising:

pin die means defining a plurality of pin channels in a pattern that matches said substrate openings and extending through a substrate support surface;

head die means supported to press a substrate against said substrate support surface;

extrusion means to direct an extrudable material through said pin channels, through said openings in said substrate to form an enlarged end against said head die means, and to form a bulge contiguous with said pin die means against the substrate support surface; and means to permit said substrate to be removed from between said pin die means and said head die means.

2. An apparatus for forming pins in a substrate as defined in claim 1 wherein said pin die means includes means to define a recess about each of said pin channels at said substrate support surface as an aid in the forming of a bulge in the extrudable material.

3. An apparatus for forming pins in a substrate as defined in claim 1 wherein said openings in said substrate are flared outwardly at opposite surfaces of said substrate to form hole diameters that are larger at each surface than the hole diameter at the center of the substrate, so that each pin formed in each opening is fixed in place.

4. An apparatus for forming pins in a substrate as defined in claim 1 wherein said head die means includes a surface to press against said substrate, said surface defining recesses in a pattern that matches said openings in said substrate to form an enlarged end in said extrudable material.

5. An apparatus for forming pins in a substrate as defined in claim 1 wherein said extrusion means to direct an extrudable material includes an extrusion die means for extruding said extrudable material through each of said pin channels into each of said openings in said substrate.

6. An apparatus for forming pins in a substrate as defined in claim 5 wherein said extrusion die means includes means to define an orifice that opens into each pin channel to direct said extrudable material into each of said pin channels.

7. An apparatus for forming pins in a substrate as defined in claim 1 wherein said means to permit removal of said substrate includes means to retract said head die means after the pins are formed in said substrate.

8. An apparatus for forming pins in a substrate as defined in claim 1 including extrusion die means having a plurality of orifices in a pattern matching said pin channels, means to retract said die means after the pins are formed, and said means to permit said substrate to be removed includes means to apply a predetermined force against the ends of the sheared pins.

9. An apparatus for forming pins in a substrate as defined in claim 1 wherein said extrudable material is electrically conductive.

10. An apparatus for forming pins in a substrate as defined in claim 9 wherein said substrate comprises electrically non-conductive material.

11. An apparatus for forming by extrusion pins of an extrudable material in a substrate having a plurality of openings arranged in a predetermined pattern, by an extrusion press, comprising:

pin die means defining a plurality of pin channels in a pattern that matches said substrate openings and extending through a substrate support surface;

extrusion die means having a plurality of orifices in a pattern that matches said substrate openings and said pin channels;

head means for pressing said substrate against said support surface and said pin die means against said extrusion die means while an extrudable material is extruded through said orifices, through said pin channels and through said openings in said substrate to form an enlarged end contiguous with a surface of said substrate against which said head means is pressing and to form a bulge contiguous with a surface of said substrate that is pressed against said support surface; and means to permit removal of a completed, pinned substrate and to position a blank substrate in said apparatus.

12. An apparatus for forming pins in a substrate as defined in claim 11 wherein said pin die means includes means to define a countersunk recess in said support surface about each of said pin channels to aid the forming of said bulge in the extrudable material.

13. An apparatus for forming pins in a substrate as defined in claim 11 wherein said openings in said substrate are enlarged at a surface that is pressed against said substrate support surface of said pin die means.

14. An apparatus for forming pins in a substrate as defined in claim 13 wherein said openings in said substrate are enlarged at a surface opposite said surface that is pressed against said substrate support surface.

15. An apparatus for forming pins in a substrate as defined in claim 11 wherein said head means includes a surface to press against said substrate, said surface having a plurality of hollows in a pattern that matches said openings in said substrate.

16. An apparatus for forming pins in a substrate as defined in claim 11 including means to move said head means for pressing said substrate during the extrusion of the extrudable material and to retract said head means after said extrusion.

17. An apparatus for forming pins in a substrate as defined in claim 16 including strip means spaced apart on said head means to support said substrate when said head means is in a retracted position.

18. An apparatus for forming pins in a substrate as defined in claim 17 wherein said strip means includes flange means against which said substrate is supported when said head means is in a retracted position.

19. An apparatus for forming pins in a substrate as defined in claim 18 wherein said strip means includes means to removably attach said strip means to said head means to permit adjustment in position for supporting substrates of different dimensions.

20. An apparatus for forming pins in a substrate as defined in claim 19 wherein said support surface in said pin die means defines recesses to match and to receive said strip means when said head means presses a substrate against said support surface.

21. An apparatus for forming pins in a substrate as defined in claim 11 wherein said means to eject includes a plurality of pin-like protrusions fitted through said head means to bear against said pins to eject a completed substrate after extrusion as said head means is moved away from said pin die means.

22. An apparatus for forming pins in a substrate as defined in claim 11 wherein said means to position a blank substrate in said apparatus includes a substrate loading arm movable from a retracted position to extend and deposit said blank substrate in said apparatus.

23. An apparatus for forming pins in a substrate as defined in claim 22 wherein said substrate loading arm includes an end extending ahead of the blank substrate to push the completed, pinned substrate from the apparatus.

24. An apparatus for forming pins in a substrate as defined in claim 23 including tray means positioned to receive each completed, pinned substrate as it is ejected from said apparatus.

25. An apparatus for forming pins in a substrate as defined in claim 11 wherein said means to permit removal of a substrate includes means in said extrusion die means to define a plurality of fluid passages located to communicate with the pins for ejecting the completed, pinned substrate from said pin die means.

26. An apparatus for forming pins in a substrate as defined in claim 11 wherein said extrudable material is electrically conductive.

27. An apparatus for forming pins in a substrate as defined in claim 26 wherein said substrate comprises electrically non-conductive material.

28. A method for forming pins of an extrudable material in a substrate by an extrusion press, the substrate being preformed with a plurality of openings arranged in a predetermined pattern, comprising the steps of:

positioning said substrate against a pin die having pin channels to match the pattern of openings in the substrate, and locking the substrate firmly in place;

extruding an extrudable material through a plurality of extrusion orifices matching the pattern of pin channels and into the openings in said substrate;

continuing said extrusion step after said openings are filled to form enlarged sections to lock each pin firmly in place; and ejecting the completed substrate.

29. A method for forming pins in a substrate as defined in claim 28 wherein the step of ejecting the completed substrate includes the step of loading a blank substrate in position.

30. A method for forming pins in a substrate as defined in claim 28 including the step of counting each completed substrate ejected.

31. A method for forming pins in a substrate as defined in claim 28 wherein said extrudable material is electrically conductive.

32. A method for forming pins in a substrate as defined in claim 31 wherein said substrate comprises electrically non-conductive material.

* * * * *